United States Patent
Jun et al.

(10) Patent No.: US 8,500,906 B2
(45) Date of Patent: Aug. 6, 2013

(54) DEVICE FOR JETTING GAS AND SOLAR CELL MANUFACTURING METHOD USING THE SAME

(75) Inventors: Gug-Il Jun, Hwaseong-si (KR); In-Ki Kim, Seoul (KR)

(73) Assignees: Samsung SDI Co., Ltd., Yongin-si (KR); Samsung Display Co., Ltd., Yongin-si (KR)

(*) Notice: Subject to any disclaimer, the term of this patent is extended or adjusted under 35 U.S.C. 154(b) by 47 days.

(21) Appl. No.: 13/117,431

(22) Filed: May 27, 2011

(65) Prior Publication Data

US 2012/0094423 A1 Apr. 19, 2012

(30) Foreign Application Priority Data

Oct. 19, 2010 (KR) .................. 10-2010-0101849

(51) Int. Cl.
*C23C 16/00* (2006.01)
(52) U.S. Cl.
USPC ........................................... 118/715
(58) Field of Classification Search
USPC .................. 118/715; 257/359; 438/627
See application file for complete search history.

(56) References Cited

U.S. PATENT DOCUMENTS

| | | | |
|---|---|---|---|
| 5,773,621 A * | 6/1998 | Nisino et al. | 96/351 |
| 6,189,485 B1 | 2/2001 | Matsuda et al. | |
| 6,933,009 B2 | 8/2005 | Ueda et al. | |
| 7,001,831 B2 | 2/2006 | Niira et al. | |
| 2006/0174827 A1* | 8/2006 | Bae et al. | 117/200 |
| 2007/0137572 A1* | 6/2007 | Matsuura et al. | 118/723 E |

FOREIGN PATENT DOCUMENTS

| | | |
|---|---|---|
| JP | 2001036112 A | 2/2001 |
| JP | 2001185502 A | 7/2001 |
| JP | 2003031826 A | 1/2003 |
| JP | 2003197537 A | 7/2003 |
| JP | 2004327653 A | 11/2004 |
| JP | 2007266093 A | 10/2007 |
| KR | 1020030039101 A | 5/2003 |
| KR | 1020060007416 A | 1/2006 |
| KR | 1020070097472 A | 10/2007 |
| KR | 1020090065704 A | 6/2009 |

* cited by examiner

*Primary Examiner* — Charles Garber
*Assistant Examiner* — Andre' C Stevenson
(74) *Attorney, Agent, or Firm* — Christie, Parker & Hale, LLP

(57) ABSTRACT

A device for disposing a gas, the device including: a chamber; a plurality of gas jetting plates disposed in the chamber, each gas jetting plate of the plurality of gas jetting plates including a plurality of gas jetting holes disposed on a surface thereof; and a gas pipe fluidly connected to the gas jetting plate and extending outside the chamber, wherein each gas jetting plate includes a first stage, which is fluidly connected to the gas pipe, and a final stage, which includes the plurality of gas jetting holes.

18 Claims, 9 Drawing Sheets

DEVICE FOR JETTING GAS AND SOLAR CELL MANUFACTURING METHOD USING THE SAME

CROSS-REFERENCE TO RELATED APPLICATION

This application claims priority to Korean Patent Application No. 10-2010-0101849, filed in the Korean Intellectual Property Office on Oct. 19, 2010, and all the benefits accruing therefrom under 35 U.S.C. §119, the content of which in its entirety is herein incorporated by reference.

BACKGROUND OF THE INVENTION (a) Field of the Invention

The present invention relates to a device for jetting gas and a solar cell manufacturing method using the same.

(b) Description of the Related Art

Solar cells convert sunlight into electrical energy and are an important clean energy or next-generation source of electrical energy. Solar cells may reduce use of fossil fuels, which cause a greenhouse effect due to discharge of $CO_2$, and may reduce use of nuclear energy, which contaminates the environment because it creates radioactive waste.

The solar cells have an upper electrode and a lower electrode formed on a substrate and generate electricity using two kinds of semiconductors, such as a P-type semiconductor and an N-type semiconductor, which are disposed between the upper electrode and the lower electrode. Solar cells may be classified depending on a material of the light absorbing layer.

A compound solar cell, which includes a Cu, In, Ga, Se ("CIGS") compound layer, has high efficiency for conversion sunlight into electricity without using silicon, and thus is unlike known silicon based solar cells. A compound solar cell may be provided by depositing copper (Cu), indium (In), gallium (Ga), and selenium (Se) compounds on an electrode which is disposed on a flexible substrate, such as a stainless steel, aluminum, or a glass substrate.

A CIGS compound layer may be formed by injecting or jetting hydrogen selenide ($H_2Se$) on a mixed layer which includes copper (Cu), indium (In), and gallium (Ga), after the mixed layer is formed.

When the hydrogen selenide is jetted onto the substrate, as the area of the solar cell is increased, and the copper, gallium, indium, and hydrogen selenide are not uniformly reacted. Accordingly, there remains a need for an improved method of jetting hydrogen selenide.

BRIEF SUMMARY OF THE INVENTION

Disclosed is a device which provides a uniform composition of a CIGS compound layer in a solar cell manufacturing process.

An embodiment provides a device for jetting gas including: a chamber; a plurality of gas jetting plates disposed in the chamber, each gas jetting plate of the plurality of gas jetting plates including a plurality of gas jetting holes disposed on a surface thereof; and a gas pipe fluidly connected to the gas jetting plate and extending outside the chamber, wherein each gas jetting plate includes a first stage, which is fluidly connected to the gas pipe, and a final stage, which includes the plurality of gas jetting holes.

One or more stages may be further disposed between the first stage and the final stage.

The first stage, and each stage between the first stage and the final stage, may include a gas moving hole.

A number of the gas moving holes of the first stage, and a number of gas moving holes of each stage between the first stage and the final stage, may increases from the first stage to the final stage.

The number of the gas jetting holes may be more than the number of the gas moving holes on a stage adjacent to the final stage.

A target substrate may be disposed opposite the plurality of the gas jetting holes of a first gas jetting plate of the plurality of gas jetting plates, and the target substrate may be disposed on a second gas jetting plate of the plurality of gas jetting plates.

Another embodiment provides a device for jetting a gas including: a body, which supplies a gas; and a gas jetting unit disposed on the body, which jets the gas supplied from the body, wherein the gas jetting unit is disposed in a vertical direction with respect to a surface of the body.

The gas jetting unit may include a plurality of gas jetting pipes, which jet the gas supplied from the body, and the gas jetting pipes may be disposed in a matrix.

Each gas jetting pipe of the plurality of gas jetting pipes may include a plurality of gas jetting holes on a surface thereof.

A diameter of a gas jetting hole proximal to the body is less than a diameter of a gas jetting hole distal to the body in a vertical direction.

A target substrate may be disposed opposite the plurality of gas jetting holes of a first gas jetting pipe of the plurality of gas jetting pipes, the target substrate may be disposed in a vertical direction with respect to a surface of the body, and the target substrate may be disposed on a second gas jetting pipe of the plurality of gas jetting pipes.

The gas jetting unit may include a plurality of gas jetting plates, which jet the gas supplied from the body, and each gas jetting plate may include a first stage, which receives the gas supplied from the body, and a final stage, which includes a plurality of gas jetting holes, which jet the gas.

A target substrate may be disposed opposite the plurality of gas jetting holes of a first gas jetting plate of the plurality of gas jetting plates, the target substrate may be disposed in a vertical direction with respect to a surface of the body, and the target substrate may be disposed on a second gas jetting plate of the plurality of gas jetting plates.

The device further may comprise a cover disposed on the body and which covers the getting unit.

Another embodiment provides a method for manufacturing a solar cell, the method including: forming a first electrode on a substrate; forming a first metal layer including copper and gallium on the first electrode; forming a second metal layer including indium on the first metal layer; disposing the substrate including the first electrode, the first metal layer, and the second metal layer in a gas jetting device; forming a P layer by jetting and heat treating hydrogen selenide onto the second metal layer; forming an N layer on the P layer; and forming a second electrode on the N layer to manufacture the solar cell, wherein the substrate is supported by the gas jetting device, the gas jetting device includes a first stage, which receives the hydrogen selenide from outside of the gas jetting device, and a gas jetting plate of the gas jetting device includes a gas jetting hole, which jets the hydrogen selenide onto the substrate.

The gas jetting device may include a body including the gas jetting plate, a cover disposed on the body, which covers the gas jetting plate, and the gas jetting plate may be disposed in a vertical direction with respect to a surface of the body.

The heat treatment may be performed at about 500 to about 600° C.

The first electrode may include a reflective conductive metal.

The second electrode may include a transparent conductive metal.

Another embodiment provides a method for manufacturing a solar cell, the method including: forming a first electrode on a substrate; forming a first metal layer including copper and gallium on the first electrode; forming a second metal layer including indium on the first metal layer; disposing the substrate including the first electrode, the first metal layer, and the second metal layer in a gas jetting device; forming a P layer by jetting and heat treating hydrogen selenide onto the second metal layer; forming an N layer on the P layer; and forming a second electrode on the N layer to manufacture the solar cell, wherein the gas jetting device includes a body, which supplies a gas, a gas jetting unit disposed on the body which jets the gas supplied from the body, and a cover disposed on the body, which covers the gas jetting unit, wherein the gas jetting unit is disposed in a vertical direction with respect to a surface of the body.

The gas jetting unit may include a plurality of gas jetting pipes or a plurality of gas jetting plates.

According to an embodiment, hydrogen selenide ($H_2Se$) may be uniformly jetted on an entire surface of a substrate, which includes copper, gallium, and indium, to thereby uniformly form a composition of a CIGS compound layer.

The gas jetting device further may comprise a cover disposed on the body and which covers the gas jetting unit

BRIEF DESCRIPTION OF THE DRAWINGS

The above and other aspects, advantages and features of this disclosure will become more apparent by describing in further detail exemplary embodiments thereof with reference to the accompanying drawings, in which.

DETAILED DESCRIPTION OF THE INVENTION

Figure 1:
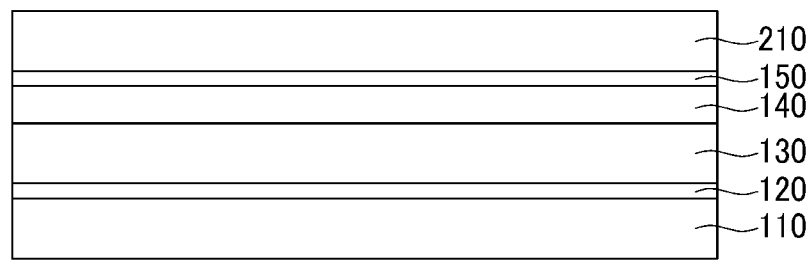
FIG. 1 is a cross sectional view of an exemplary embodiment of a solar cell.

The present invention will be described more fully hereinafter with reference to the accompanying drawings, in which exemplary embodiments of the invention are shown. As those skilled in the art would realize, the disclosed embodiments may be modified in various different ways, all without departing from the spirit or scope of the present invention. Thus these embodiments are provided so that this disclosure will be thorough and complete, and will fully convey the present invention to those skilled in the art.

In the drawings, the thickness of layers, films, panels, regions, etc., are exaggerated for clarity. When a layer is referred to as being "on" another layer, substrate, or other element, it can be directly on another layer, substrate, or other element, or a third intervening layer, substrate, or other element may be present therebetween. In contrast, when an element is referred to as being "directly on" another element, there are no intervening elements present. As used herein, the term "and/or" includes any and all combinations of one or more of the associated listed items. Throughout the specification, like reference numerals refer to like elements.

It will be understood that, although the terms "first," "second," "third" etc. may be used herein to describe various elements, components, regions, layers and/or stages, these elements, components, regions, layers and/or stages should not be limited by these terms. These terms are only used to distinguish one element, component, region, layer, or stage from another element, component, region, layer, or stage. Thus, "a first element," "component," "region," "layer," or "stage" discussed below could be termed a second element, component, region, layer, or stage without departing from the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 is a cross sectional view of a solar cell according to an exemplary embodiment.

Referring to FIG. 1, the solar cell includes a lower electrode 120 disposed on a first substrate 110.

The lower electrode 120 comprises a reflective conductive metal, such as molybdenum (Mo), aluminum (Al), or copper (Cu). A combination comprising at least one of the foregoing can be used.

A P layer 130 and an N layer 140 are sequentially disposed on the lower electrode 120. The P layer 130 comprises a CIGS compound, such as a $CuInGaSe_2$ compound, and the N layer 140 is formed by disposing a CdS layer or a ZnS layer. Herein, the P layer 130 is a light absorbing layer.

An upper electrode 150 is disposed on the N layer 140. The upper electrode 150 comprises a transparent conductive metal, such as ZnO, indium tin oxide ("ITO"), or indium zinc oxide ("IZO"). A combination comprising at least one of the foregoing can be used. An upper surface of the upper electrode 150 may be textured in order to increase an effective quantity of light absorbed in the solar cell by reducing light reflection on the surface of the solar cell.

A second substrate 210 is disposed on the upper electrode 150.

Hereinafter, referring to FIGS. 2 to 7, an exemplary embodiment of a method of manufacturing the solar cell of FIG. 1 will be further disclosed.

FIGS. 2 to 7 are diagrams sequentially showing the exemplary embodiment of the method of manufacturing the solar cell of FIG. 1.

Figure 2:
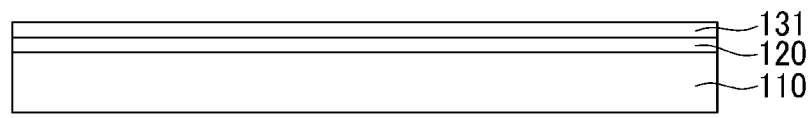
FIGS. 2 to 7 sequentially show an exemplary embodiment of a method of manufacturing the solar cell of FIG. 1.

First, as shown in FIG. 2, a lower electrode 120, which comprises a reflective conductive metal such as molybdenum, aluminum, or copper, or a combination comprising at least one of the foregoing, is disposed on a first substrate 110, and a first layer 131 is formed by sputtering an alloy of copper (Cu) and gallium (Ga) on the lower electrode 120.

Figure 3:
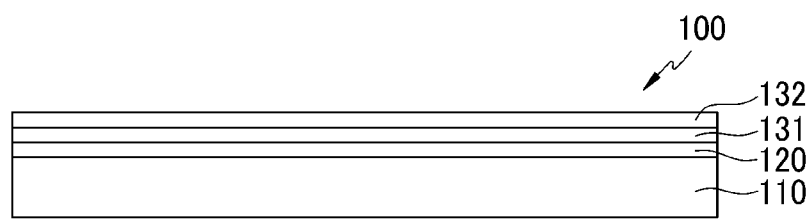

Thereafter, as shown in FIG. 3, a second layer 132 is formed by sputtering indium (In) on the first layer 131. Herein, a target substrate 100 comprises the first substrate 110 on which the lower electrode 120, the first layer 131, and the second layer 132 are sequentially formed.

Figure 4:
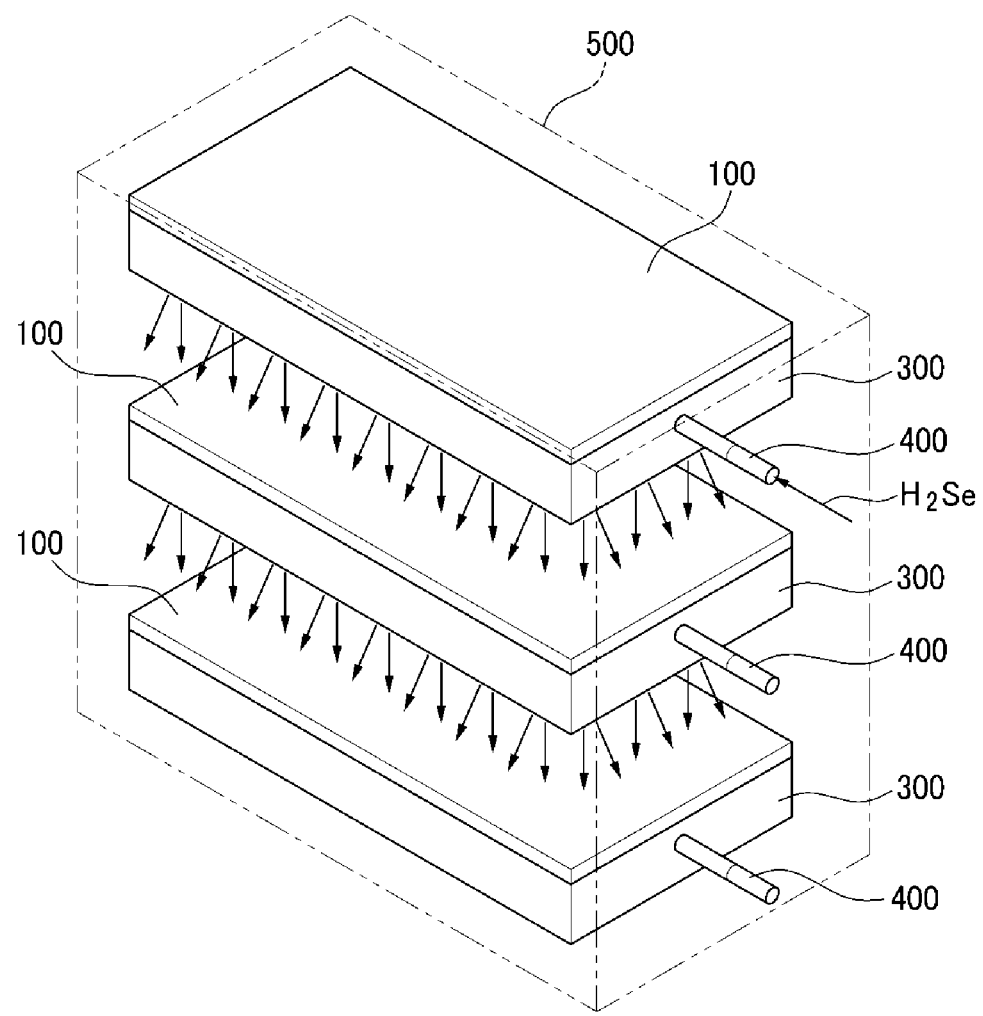

Thereafter, as shown in FIG. 4, heat treatment is performed and hydrogen selenide ($H_2Se$) is disposed on an entire surface of the second layer 132. A temperature of the heat treatment may be in the range of about 300 to about 800° C., specifically about 400 to about 700° C., more specifically about 500 to about 600° C.

Further, the heat treatment of hydrogen selenide may be performed in a chamber 500.

A plurality of gas jetting plates 300 are disposed in the chamber 500. The plurality of gas jetting plates 300 may comprise quartz or a metal. On each gas jetting plate of the plurality of gas jetting plates 300 is a target substrate 100, and each target substrate 100 is disposed on and supported by a top surface of a respective gas jetting plate. The target substrate 100 of the upper-most gas jetting plate is optional. Hydrogen selenide may be supplied to the chamber 500 from outside of the chamber 500 through a gas pipe 400. The hydrogen selenide may be jetted onto a target substrate 100 from the lower part of an opposite gas jetting plate of the plurality of gas jetting plates 300.

Figure 5:
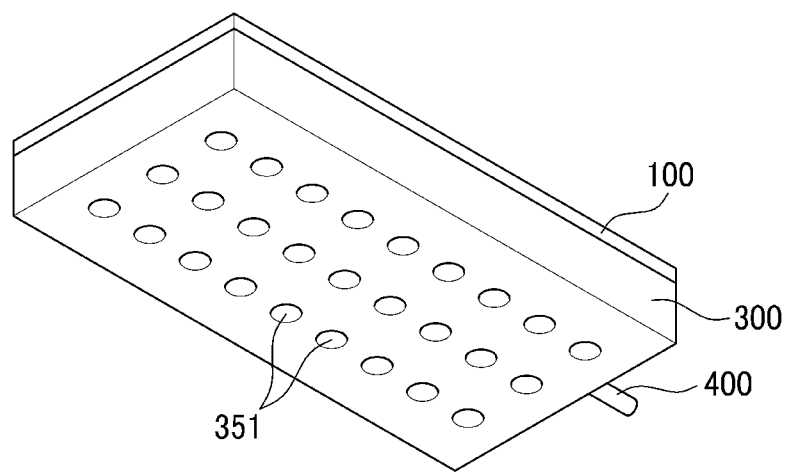
Figure 6:
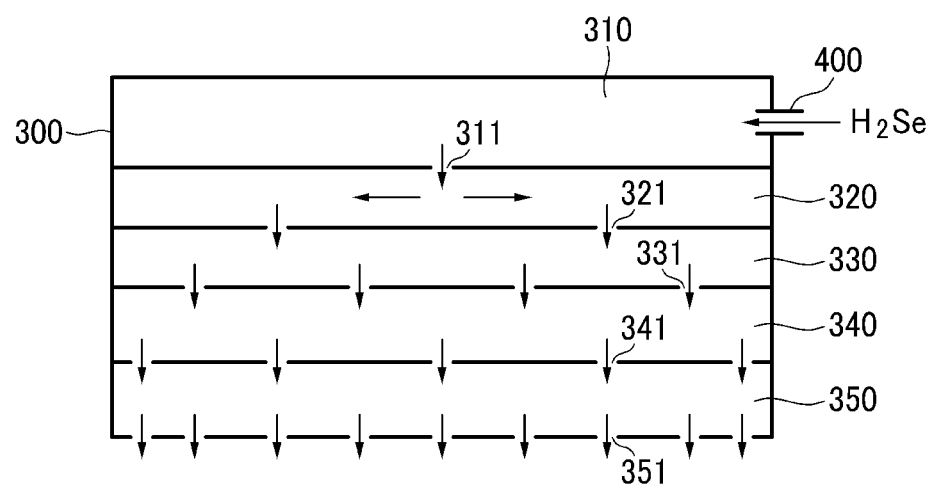

Referring to FIGS. 5 and 6, the plurality of gas jetting plates 300 will be described in further detail.

As shown in FIGS. 5 and 6, the lower part of each gas jetting plate comprises a plurality of gas jetting holes 351. Hydrogen selenide is uniformly jetted onto each target substrate 100 through the plurality of gas jetting holes 351.

Each gas jetting plate may comprise at least one of a first stage 310, a second stage 320, a third stage 330, a fourth stage 340, and a fifth stage 350. Gas moving holes 311, 321, 331, and 341, through which a gas, e.g., hydrogen selenide, moves to a next stage, are disposed in the first stage 310, the second stage 320, the third stage 330, and the fourth stage 340, respectively.

In an embodiment of a gas jetting process, hydrogen selenide is supplied through the gas pipe 400. The hydrogen selenide supplied through the gas pipe 400 is jetted to the second stage 320 from the first stage 310 through the gas moving hole 311 of the first stage. Hydrogen selenide of the second stage 320 is jetted to the third stage 330 through the gas moving hole 321 of the second stage, hydrogen selenide of the third stage 330 is jetted to the fourth stage 340 through the gas moving hole 331 of the third stage, and hydrogen selenide of the fourth stage 340 is jetted to the fifth stage 350 through the gas moving hole 341 of the fourth stage. Each stage may independently comprise a single gas moving hole or a plurality of gas moving holes. Moreover, hydrogen selenide may be jetted onto the target substrate 100 from the fifth stage 350 through the plurality of gas jetting holes 351.

The number of the gas moving holes 311, 321, 331, and 341 of the first stage to the fourth stage and the number gas jetting holes 351 may be selected such that the number of holes in any stage is equal to or greater than, or greater than, the number of holes in a prior stage.

Thus the number of gas moving holes may increase from the first stage to the fourth stage, and the number of of gas jetting holes may be equal to or greater than, or greater than, the number of gas moving holes of the fourth stage, such that hydrogen selenide supplied to each of the stages 310, 320, 330, 340 and 350. Further, the stages may be configured such that the hydrogen selenide has a uniform flow velocity when the hydrogen selenide is jetted to the stages 320, 330, 340, and 350, and the target substrate 100. That is, hydrogen selenide supplied to the plurality of gas jetting plates 300 is uniformly jetted onto the target substrate 100.

In an embodiment, each gas jetting plates has five stages, but the number of stages is not limited thereto and each gas jetting plate may independently comprise five or more stages. Each gas jetting plates may independently comprise about 1 to about 20 stages, specifically about 2 to about 10 stages, more specifically about 3 to about 8 stages, or about 4 to about 6 stages.

Figure 7:
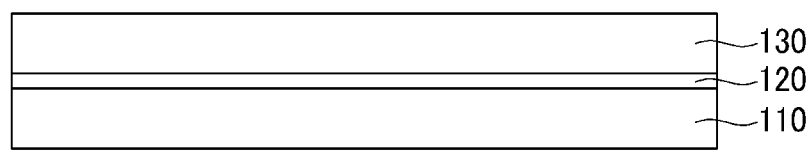

When hydrogen selenide is jetted onto the target substrate 100 and is heat treated, as shown in FIG. 7, a P layer 130 comprising, consisting essentially of, or consisting of CIGS, e.g., $CuInGaSe_2$, is formed by contacting selenium with at least one of the first layer 131 and the second layer 132. As such, hydrogen selenide is uniformly jetted, to thereby uniformly form a composition of the light absorbing layer of CIGS.

Next, as shown in FIG. 1, the N layer 140 is formed by disposing (e.g., depositing) CdS or ZnS, and an upper electrode 150 is formed on the N layer 140. In an embodiment, a combination comprising at least one of the foregoing may be used. The upper electrode 150 may comprise a transparent conductive metal, such as ZnO, ITO, or IZO. A combination comprising at least one of the foregoing can be used. In an embodiment, a surface of the upper electrode 150 may be textured, i.e., to form an unevenness on a surface thereof, by etching the top of the upper electrode 150. The texturing may increase an effective quantity of light absorbed in the solar cell by reducing light reflection on the surface of the solar cell.

Hereinafter, referring to FIGS. 8 to 12, another exemplary embodiment of the method for manufacturing the solar cell shown in FIG. 1 will be described.

The manufacturing method of this embodiment is the same as the exemplary embodiment described above, except that the methods are different from each other in respect to a device for jetting hydrogen selenide.

FIGS. 8 to 12 are diagrams showing an embodiment of a device for jetting hydrogen selenide onto a target substrate.

Figure 8:
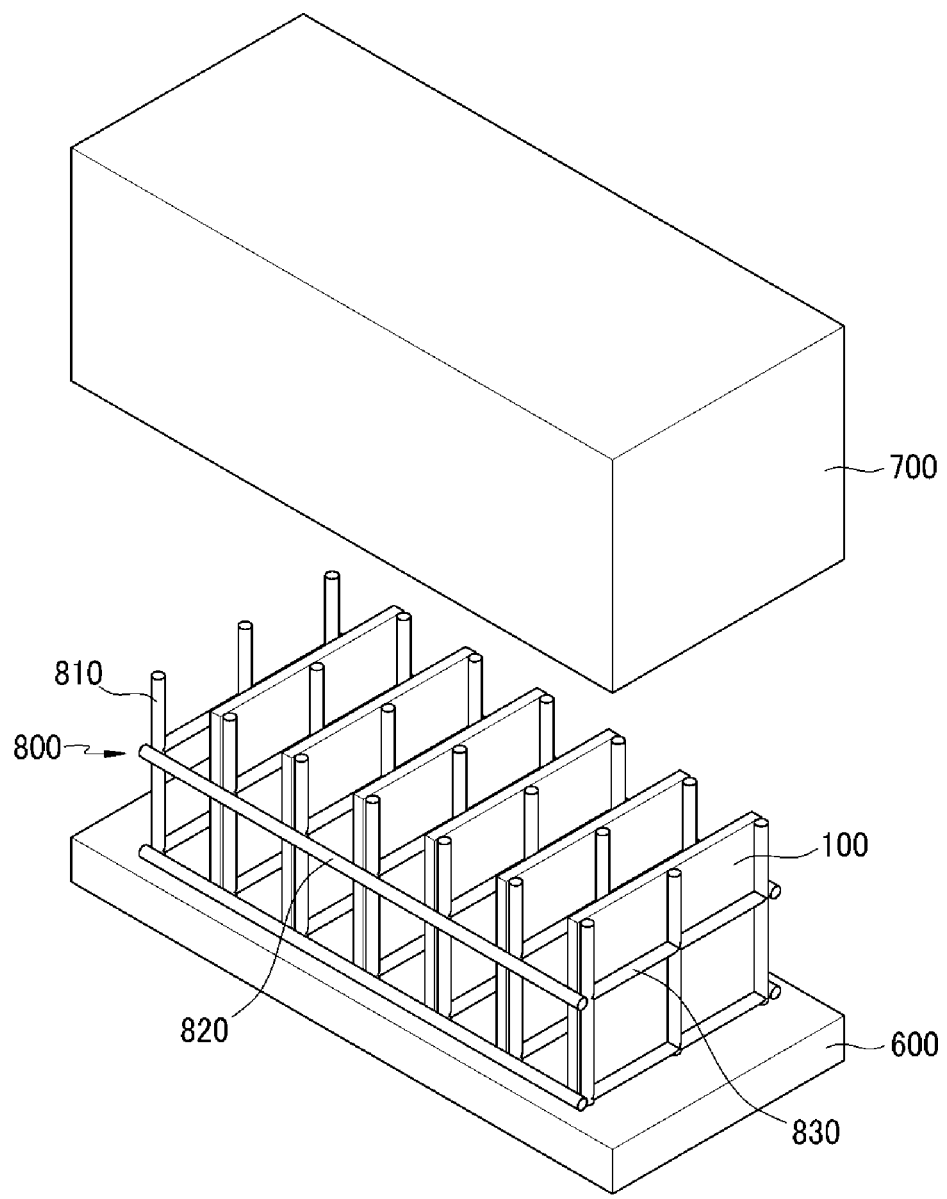
FIGS. 8 to 12 are diagrams showing an exemplary embodiment of a gas jetting device in which hydrogen selenide is jetted onto a target substrate.
Figure 9:
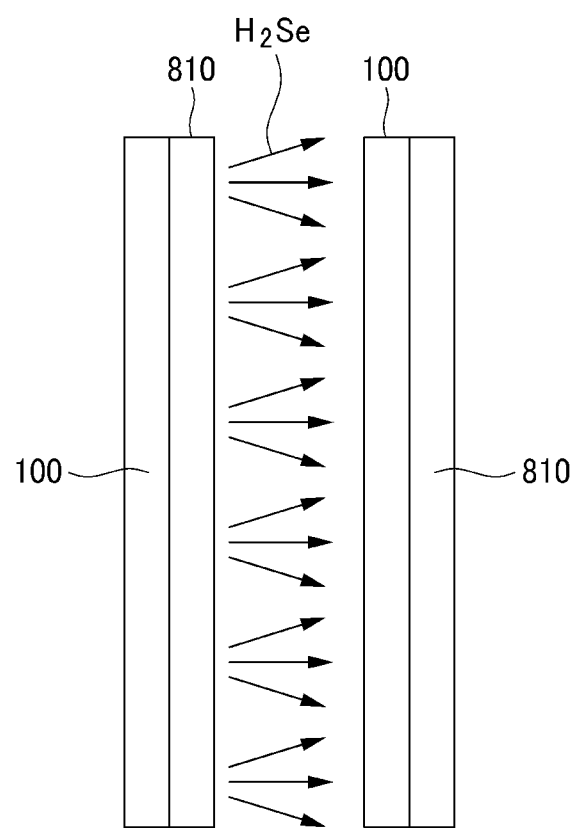

As shown in FIGS. 8 and 9, the gas jetting device includes a body 600, a gas jetting unit 800 disposed on the body 600, and a cover 700, which can cover the gas jetting unit 800.

The gas jetting unit 800 includes a plurality of gas jetting pipes 810 and a plurality of frames 820 and 830 supporting the pipes. The plurality of gas jetting pipes 810 are disposed in a vertical direction with respect to a surface of the body 600 and are disposed in a matrix having columns and rows, wherein a space is defined between each pair of adjacent rows of the gas jetting pipes 810. A target substrate 100 is positioned in the space.

A surface of each gas jetting pipe of the plurality of gas jetting pipes 810 may support (e.g., contact) a surface of a respective target substrate 100, and another surface of each gas jetting pipe may jets hydrogen selenide onto an adjacent target substrate. A distance between the gas jetting pipe and the adjacent target substrate may be in the range of about 1 to about 100 millimeters (mm), specifically about 5 to about 30 mm, and more specifically, in the range of about 10 to about 20 mm, and the foregoing may provide a desirable distribution of hydrogen selenide on each target substrate.

Figure 10:
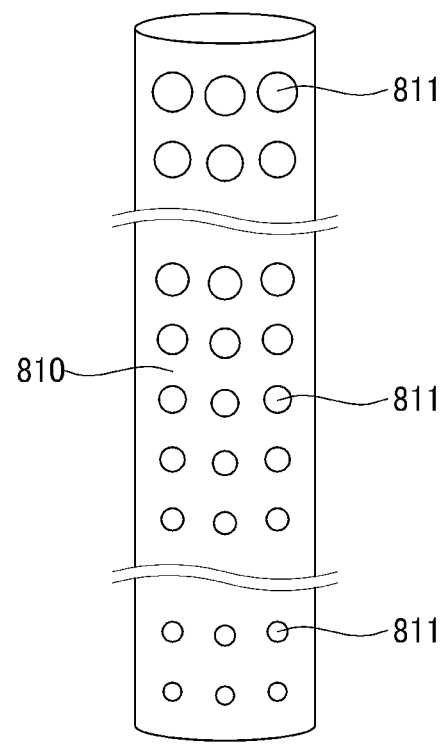

As shown in FIG. 10, each gas jetting pipe of the plurality of gas jetting pipes 810 includes a plurality of gas jetting holes 811. Hydrogen selenide is supplied to the gas jetting pipe from the body 600. Because the body 600 is disposed below the plurality of gas jetting pipes 810, a flow velocity of hydrogen selenide in the gas jetting holes 811 disposed on a bottom portion of each gas jetting pipe, i.e., a portion of the gas jetting pipe proximal the body, is greater than that in the gas jetting holes 811 disposed on a top portion of each gas jetting pipe i.e., a portion of the gas jetting pipe distal to the body. In an embodiment, a diameter of the gas jetting holes increases according to a distance in a direction away from the body. Accordingly, because the diameters of the gas jetting holes of the plurality of gas jetting holes 811 increases in a direction towards the top of each gas jetting pipe, each of the gas jetting holes has a uniform flow velocity of the hydrogen selenide, and thus hydrogen selenide may be uniformly jetted onto the target substrate 100.

In another embodiment, the hydrogen selenide is jetted onto the target substrate 100 through a gas pipe having a plate shape.

Figure 11:
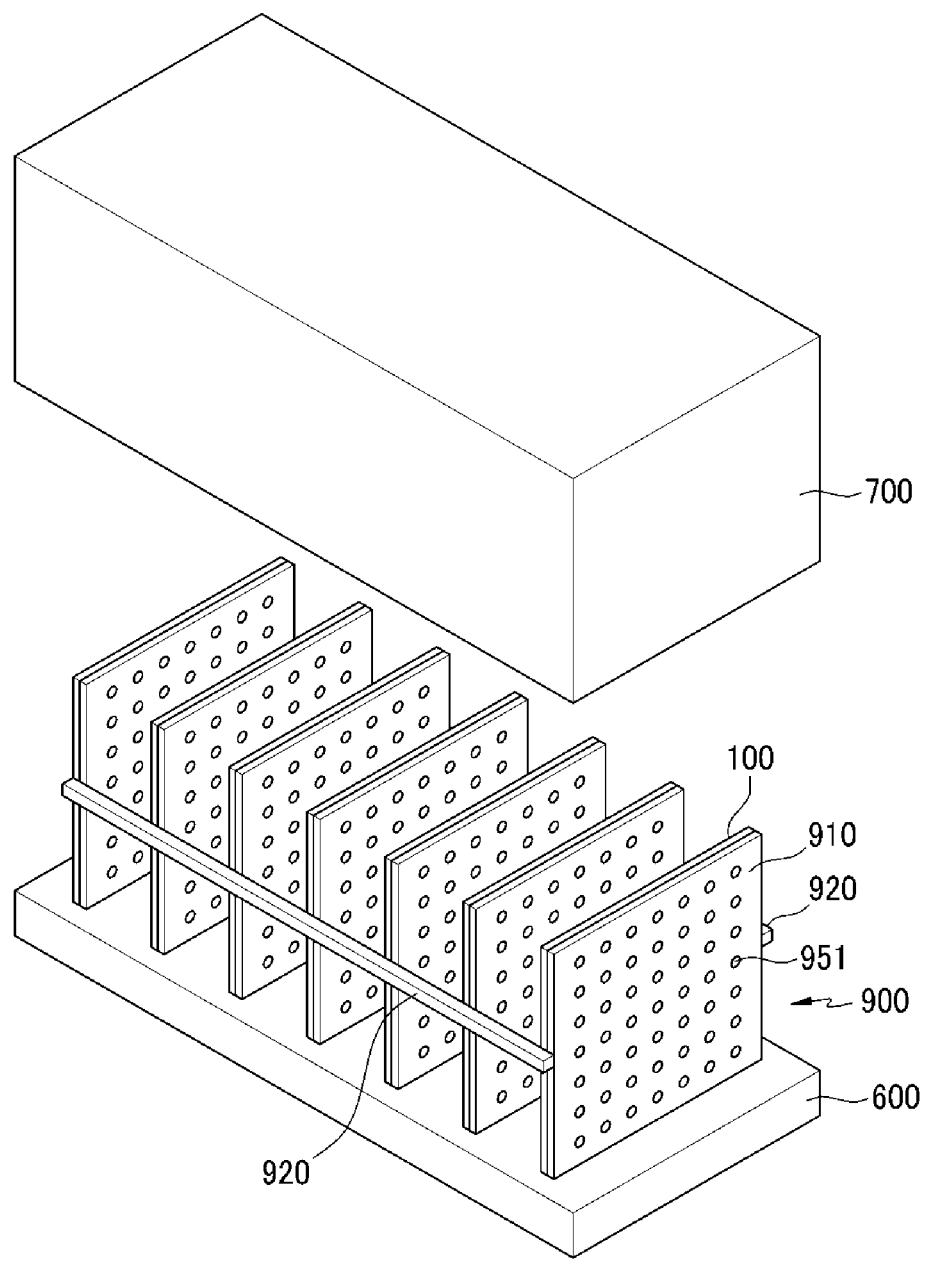
Figure 12:
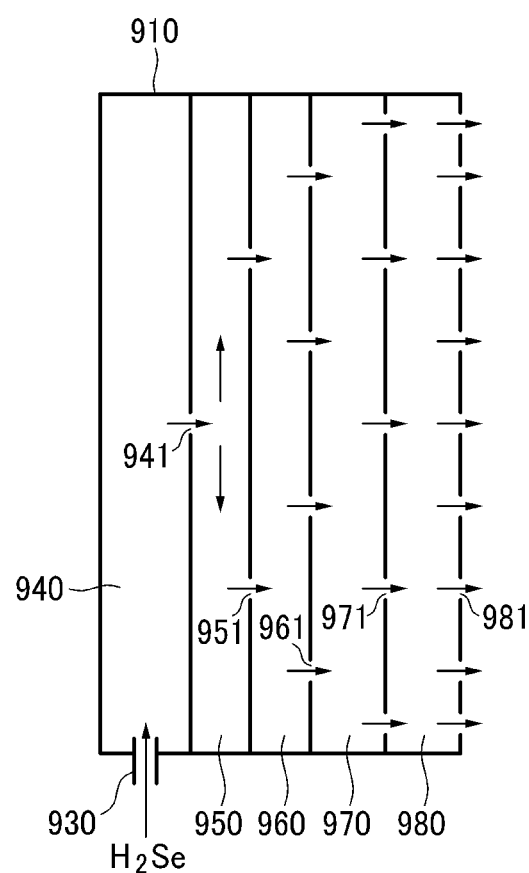

As shown in FIGS. 11 and 12, an embodiment of a gas jetting unit 900 includes a gas jetting plate 910 and a frame 920 supporting the plate. The gas jetting plate 910 is disposed in a vertical direction with respect to a surface of the body 600, and the target substrate 100 is disposed on a first surface of the gas jetting plate 910. A second surface of the gas jetting plate 910, which is opposite the first surface of the gas jetting plate 910, is configured to jet hydrogen selenide onto an adjacent target substrate 100.

The gas jetting plate 910 includes a first stage 940, a second stage 950, a third stage 960, a fourth stage 970, and a fifth stage 980. Gas moving holes 941, 951, 961, and 971, through which gas is jetted to a next stage, are disposed at the first stage 940, the second stage 950, the third stage 960, and the fourth stage 970, respectively.

In an embodiment of a gas jetting process, hydrogen selenide is supplied from the body 600 through a gas pipe 930. Hydrogen selenide supplied through the gas pipe 930 is jetted to the second stage 950 from the first stage 940 through the gas moving hole 941 of the first stage. Hydrogen selenide of the second stage 950 is jetted to the third stage 960 through the gas moving hole 951 of the second stage, hydrogen selenide of the third stage 960 is jetted to the fourth stage 970 through the gas moving hole 961 of the third stage, and hydrogen selenide of the fourth stage 970 is jetted to the fifth stage 980 through the gas moving hole 971 of the fourth stage. Moreover, hydrogen selenide is jetted to the target substrate 100 from the fifth stage 980 through the gas jetting hole 981.

The number of the gas moving holes 941, 951, 961, and 971 of the first stage to the fourth stage and the number of gas jetting holes 981 may be selected such that the number of holes in any stage is equal to or greater than, or greater than, the number of holes in a prior stage. Thus the number of gas moving holes may increase from the first stage to the fourth stage, and the number of of gas jetting holes may be equal to or greater, or greater than, the number of gas moving holes of the fourth stage, such that hydrogen selenide supplied to each of the first to fifth stages 940, 950, 960, 970 and 980. Further, the hydrogen selenide may have a uniform flow velocity as hydrogen selenide is jetted to the second to fifth stages 950, 960, 970 and 980 and the target substrate 100. That is, hydrogen selenide supplied to the gas jetting plate 910 is uniformly jetted onto the target substrate 100.

In an embodiment, the gas jetting plate 910 has five stages, but it is not limited thereto and may have five or more stages. The gas jetting plate may have about 1 to about 20 stages, specifically about 2 to about 10 stages, more specifically about 3 to about 8 stages, or about 4 to about 6 stages.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A device for disposing a gas, the device comprising:
   a chamber;
   a plurality of gas jetting plates disposed in the chamber, each gas jetting plate of the plurality of gas jetting plates comprising a plurality of gas jetting holes disposed on a surface thereof; and
   a gas pipe fluidly connected to the gas jetting plate and extending outside the chamber,
   wherein each gas jetting plate includes a first stage, which is fluidly connected to the gas pipe, and a final stage, which comprises the plurality of gas jetting holes, and
   wherein a target substrate is arrangeable opposite the plurality of gas jetting holes of a first gas jetting plate of the plurality of gas jetting plates and between the first gas jetting plate and a second gas jetting plate of the plurality of gas jetting plates.

2. The device of claim 1, wherein one or more stages are further disposed between the first stage and the final stage.

3. The device of claim 2, wherein the first stage, and each stage between the first stage and the final stage, comprises a gas moving hole.

4. The device of claim 3, wherein a number of the gas moving holes of the first stage and a number of gas moving holes of each stage between the first stage and the final stage increases from the first stage to the final stage.

5. The device of claim 4, wherein the number of the gas jetting holes is more than the number of the gas moving holes on a stage adjacent to the final stage.

6. A device for disposing a gas, the device comprising:
a chamber;
a plurality of gas jetting plates disposed in the chamber, each gas jetting plate of the plurality of gas jetting plates comprising a plurality of gas jetting holes disposed on a surface thereof: and
a gas pipe fluidly connected to the gas jetting plate and extending outside the chamber,
wherein each gas jetting plate includes a first stage, which is fluidly connected to the gas pipe, and a final stage, which comprises the plurality of gas jetting holes,
wherein one or more stages are further disposed between the first stage and the final stage,
wherein the first stage, and each stage between the first stage and the final stage, comprises a gas moving hole,
wherein a number of the gas moving holes of the first stage and a number of gas moving holes of each stage between the first stage and the final stage increases from the first stage to the final stage,
wherein the number of the gas jetting holes is more than the number of the gas moving holes on a stage adjacent to the final stage, and
wherein a target substrate is disposed opposite the plurality of gas jetting holes of a first gas jetting plate of the plurality of gas jetting plates, and the target substrate is disposed on a second gas jetting plate of the plurality of gas jetting plates.

7. A device for jetting gas, comprising:
a body, which supplies a gas; and
a gas jetting unit comprising a plurality of gas jetting pipes or a plurality of gas jetting plates disposed on the body, each of the gas jetting pipes or the gas jetting plates having a plurality of gas jetting holes which jets the gas supplied from the body,
wherein the gas jetting unit is disposed in a vertical direction with respect to a surface of the body, and
wherein a target substrate is arrangeable between a pair of adjacent gas jetting pipes of the plurality of gas jetting pipes or a pair of adjacent gas jetting plates of the plurality of gas jetting plates.

8. The device of claim 7, wherein:
the gas jetting unit comprises the plurality of gas jetting pipes, which jet the gas supplied from the body, and
the gas jetting pipes are disposed on the body in a matrix.

9. The device of claim 8, wherein each gas jetting pipe of the plurality of gas jetting pipes includes the plurality of gas jetting holes on a surface thereof.

10. A device for jetting gas, comprising:
a body, which supplies a gas; and
a gas jetting unit disposed on the body, which jets the gas supplied from the body,
wherein the gas jetting unit is disposed in a vertical direction with respect to a surface of the body,
wherein:
the gas jetting unit comprise a plurality of gas jetting pipes, which let the gas supplied from the body, and
the gas jetting pipes are disposed on the body in a matrix,
wherein each gas jetting pipe of the plurality of gas jetting pipes includes a plurality of gas jetting holes on a surface thereof, and
wherein a diameter of a gas jetting hole proximal to the body is less than a diameter of a gas jetting hole distal to the body in a vertical direction.

11. The device of claim 10, wherein:
a target substrate is disposed opposite the plurality of gas jetting holes of a first gas jetting pipe of the plurality of gas jetting pipes,
the target substrate is disposed in a vertical direction with respect to a surface of the body, and
the target substrate is disposed on a second gas jetting pipe of the plurality of gas jetting pipes.

12. The device of claim 7, wherein
the gas jetting unit comprises the plurality of gas jetting plates, which jet the gas supplied from the body, and
each gas jetting plate comprises a first stage, which receives the gas supplied from the body, and a final stage, which comprises the plurality of gas jetting holes, which jet the gas.

13. The device of claim 12, wherein a plurality of stages are further disposed between the first stage and the final stage.

14. The device of claim 13, wherein the first stage and each stage between the first stage and the final stage comprises a gas moving hole.

15. The device of claim 14, wherein a number of the gas moving holes of the first stage and a number of gas moving holes of each stage between the first stage and the final stage increases from the first stage to the final stage.

16. The device of claim 15, wherein the number of the gas jetting holes is more than the number of the gas moving holes on a stage adjacent to the final stage.

17. A device for jetting gas, comprising:
a body, which supplies a gas; and
a gas jetting unit disposed on the body, which jets the gas supplied from the body,
wherein the gas jetting unit is disposed in a vertical direction with respect to a surface of the body,
wherein:
the gas jetting unit comprises a plurality of gas jetting plates, which jet the gas supplied from the body, and
each gas jetting plate comprises a first stage, which receives the gas supplied from the body, and a final stage, which comprises a plurality of gas jetting holes, which jet the gas,
wherein a plurality of stages are disposed between the first stage and the final stage,
wherein the first stage and each stage between the first stage and the final stage comprises a gas moving hole,
wherein a number of the gas moving holes of the first stage and a number of gas moving holes of each stage between the first stage and the final stage increases from the first stage to the final stage,
wherein the number of the gas jetting holes is more than the number of the gas moving holes on a stage adjacent to the final stage, and
wherein:
a target substrate is disposed opposite the plurality of gas jetting holes of a first gas jetting plate of the plurality of gas jetting plates,
the target substrate is disposed in a vertical direction with respect to a surface of the body, and
the target substrate is disposed on a second gas jetting plate of the plurality of gas jetting plates.

18. The device of claim 7, further comprising a cover disposed on the body and which covers the gas jetting unit.

* * * * *

UNITED STATES PATENT AND TRADEMARK OFFICE
CERTIFICATE OF CORRECTION

PATENT NO. : 8,500,906 B2
APPLICATION NO. : 13/117431
DATED : August 6, 2013
INVENTOR(S) : Gug-Il Jun et al.

It is certified that error appears in the above-identified patent and that said Letters Patent is hereby corrected as shown below:

In the Claims

Column 9, Claim 6, line 6      Delete "thereof:"
Insert -- thereof; --

Column 9, Claim 10, line 55      Delete "comprise"
Insert -- comprises --

Column 9, Claim 10, line 56      Delete "let"
Insert -- jet --

Column 10, Claim 17, line 41      After "are"
Insert -- further --

Signed and Sealed this
Ninth Day of December, 2014

Michelle K. Lee
*Deputy Director of the United States Patent and Trademark Office*